United States Patent
Akamine et al.

[11] Patent Number: 5,874,352
[45] Date of Patent: Feb. 23, 1999

[54] METHOD OF PRODUCING MIS TRANSISTORS HAVING A GATE ELECTRODE OF MATCHED CONDUCTIVITY TYPE

[75] Inventors: Tadao Akamine; Kenji Aoki, both of Tokyo, Japan

[73] Assignee: Sieko Instruments Inc., Chiba, Japan

[21] Appl. No.: 544,454

[22] Filed: Oct. 18, 1995

Related U.S. Application Data

[63] Continuation of Ser. No. 970,248, Nov. 2, 1992, abandoned, which is a continuation of Ser. No. 620,623, Dec. 3, 1990, abandoned.

[30] Foreign Application Priority Data

Dec. 6, 1989 [JP] Japan .................................... 1-318560

[51] Int. Cl.$^6$ .................................................. H01L 21/223
[52] U.S. Cl. .......................................... 438/565; 438/197
[58] Field of Search ........................... 437/141, 146, 437/41 RLD, 41 RCM, 939, 950, 946, 165, 166; 438/565, 197, 535, 521, 513

[56] References Cited

U.S. PATENT DOCUMENTS

| | | | |
|---|---|---|---|
| 3,540,950 | 11/1970 | Joseph | 437/166 |
| 3,590,471 | 7/1971 | Lepselter . | |
| 3,673,679 | 7/1972 | Carbajal, III et al. . | |
| 3,888,706 | 6/1975 | Dingwall | 437/164 |
| 4,242,691 | 12/1980 | Kotani et al. . | |
| 4,395,433 | 7/1983 | Nagakubo et al. . | |
| 4,441,932 | 4/1984 | Akasaka et al. . | |
| 4,618,381 | 10/1986 | Sato et al. . | |
| 4,737,471 | 4/1988 | Shirato et al. . | |
| 4,791,074 | 12/1988 | Tsunashima et al. | 437/160 |
| 4,861,729 | 8/1989 | Fuse et al. . | |
| 4,912,065 | 3/1990 | Mizuno et al. . | |
| 4,948,744 | 8/1990 | Kita . | |
| 5,124,272 | 6/1992 | Saito et al. | 437/41 |

(List continued on next page.)

FOREIGN PATENT DOCUMENTS

| | | |
|---|---|---|
| 316165A3 | 5/1989 | European Pat. Off. . |
| 0322921 | 7/1989 | European Pat. Off. . |
| 32292 | 7/1989 | European Pat. Off. . |
| 322921 | 7/1989 | European Pat. Off. . |
| 0413982 | 2/1991 | European Pat. Off. . |
| 417457A2 | 3/1991 | European Pat. Off. . |
| 2245852 | 3/1974 | Germany . |
| 63166220 | 12/1986 | Japan . |
| 62-271475 | 4/1987 | Japan . |
| 63-239939 | 5/1988 | Japan . |

(List continued on next page.)

OTHER PUBLICATIONS

"Metal–Oxide–Silicon Field–Effect Transistor Made by Means of Solid–Phase Doping", by Gong et al.; J. Appl. Phys. 65 (11), 1 Jun. 1989 pp. 4435–4437.

Leung, D.L., et al., "CMOS Devices Fabricated in Thin Epitaxial Silicon on Oxide", 1989 IEEE SOS/SOI Technology Conference Oct., 1989, pp. 74–75.

"Ultrashallow, high doping of boron using molecular layer doping"; by Nishizawa; Applied Physics Letters; 56(1990)2 Apr., No. 14 pp. 1334–1335.

(List continued on next page.)

*Primary Examiner*—Caridad Everhart
*Attorney, Agent, or Firm*—Loeb & Loeb LLP

[57] ABSTRACT

A method of producing an MIS transistor by preparing a substrate formed with a gate electrode and a semiconductor layer which defines a source region and a drain region, removing a natural oxide film from a surface of the gate electrode and from a surface of the semiconductor layer to expose an active surface, delivering a source gas containing an impurity component to the exposed active surface to deposit thereon an impurity adsorption film, and annealing the substrate to diffuse the impurity component from the impurity adsorption film into the gate electrode and concurrently into the semiconductor layer to form the source and drain regions. The gate electrode has the same conductivity type as the source and drain regions.

2 Claims, 4 Drawing Sheets

U.S. PATENT DOCUMENTS

| | | | |
|---|---|---|---|
| 5,183,777 | 2/1993 | Doki et al. | 437/160 |
| 5,242,859 | 9/1993 | Degelormo et al. | |
| 5,338,697 | 8/1994 | Aoki et al. | 437/40 |
| 5,387,545 | 2/1995 | Kiyota et al. | 437/165 |
| 5,599,735 | 2/1997 | Mosleki. | |

FOREIGN PATENT DOCUMENTS

| | | |
|---|---|---|
| 63-166220 | 7/1988 | Japan. |
| 1192159 | 2/1989 | Japan. |
| 1384206 | 2/1975 | United Kingdom. |
| 8201380 | 10/1981 | WIPO. |

FOREIGN PATENT DOCUMENTS

"Simple–Structured PMOSFET Fabricated Using Molecular Layer Doping", Jun–Ichi Nishizawa, et al., *IEEE*, 1990 pp. 105–106.

L. Ming, et al. "Doping Reaction of $PH_3$ and $B_2H_6$ with Si(100)" *J. Appl. Phys.* vol. 59, No. 12 (Jun. 1986) pp. 4032–4037.

Ghandi, Ed. *VLSI Fabrication Principles*, Wiley & Sons, NY (1983) p. 234.

5,874,352

METHOD OF PRODUCING MIS TRANSISTORS HAVING A GATE ELECTRODE OF MATCHED CONDUCTIVITY TYPE

This is a continuation of application Ser. No. 07/970,248 filed Nov. 2, 1992, now abandoned, which is itself a continuation of application Ser. No. 07/620,623, filed Dec. 1, 1990, and also abandoned.

BACKGROUND OF THE INVENTION

The present invention relates to a method of producing an MIS transistor having a gate electrode of the same conductivity type as that of the source and drain regions of the transistor. Hereinafter, such gate electrode is referred to as a "matched conductivity type" gate electrode.

Conventionally, when producing an MIS transistor having a gate electrode of matched conductivity type, an ion implantation method or a predeposition method is utilized to dope the same conductivity type of impurity into the gate electrode and the source and drain regions.

However, the conventional doping methods have various drawbacks. With regard to the ion implantation method, the impurity particles are implanted to a certain depth due to the kinetic energy of the accelerated impurity ion particles. Therefore, when activation of the ion particles is carried out by thermal treatment after the ion implantation, the impurity particles are diffused from the gate electrode to a gate insulating film and further to a channel region.

With regard to the predeposition method, since the impurity is diffused through an oxide film, the impurity density cannot be controlled well. Further, since this technique involves relatively high temperature processing at about 900° C., impurity particles may be diffused from the gate electrode into the channel region similarly as in case of the ion implantation.

As noted above, when the conventional methods such as ion implantation and predeposition are utilized to effect the impurity doping to a gate electrode of a matched conductivity type MIS transistor, the impurity particles having one conductivity type opposite to that of the channel region are inadvertently diffused from the gate electrode into the channel region disposed under the gate electrode, thereby causing drawbacks such as shift of threshold voltage of the transistor, and reduction of carrier mobility due to excess density of impurity atoms in the channel region. Such drawbacks are most serious in the P channel MIS transistor having the matched conductivity type gate electrode which contains P type impurity of boron (B), which has a relatively great diffusion coefficient.

SUMMARY OF THE INVENTION

In view of the above noted drawbacks of the prior art, an object of the present invention is to provide a new method of doping an impurity in a limited manner only into a shallow surface portion of the matched conductivity type gate electrode so as to avoid diffusion of the impurity into the channel region.

According to the invention, an active surface is exposed on a surface of a gate electrode and on a patterned surface area of a semiconductor layer. Then, a gas containing an impurity component is applied to the exposed active surface to deposit thereon an adsorption film containing the impurity component. Thereafter, thermal treatment is effected to diffuse the impurity component concurrently into the gate electrode and into the patterned surface area to form a pair of source and drain regions in the semiconductor layer by solid-phase diffusion. The above new doping method is hereinafter referred to as "Molecular Layer Doping (MLD)". By using MLD, an MIS transistor can be formed with a gate electrode having the same conductivity type as that of the source and drain regions.

DESCRIPTION OF THE PREFERRED EMBODIMENTS

FIGS. 1A–1D show a typical method of producing an MIS transistor having a gate electrode of the matched conductivity type according to the invention. This embodiment involves production of a P channel transistor in which a P type impurity, for example boron, is doped into a device region.

Figure 1A:
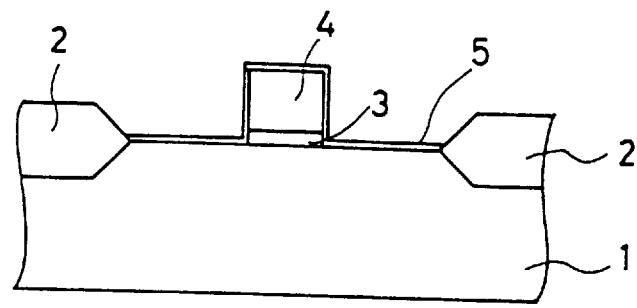
FIGS. 1A–1D are elevational views showing successive steps of a method according to a first embodiment of the present invention for producing an MIS transistor having a gate electrode of matched conductivity type.

In the FIG. 1A step, there is provided a semiconductor substrate 1 composed of silicon. A field oxide film 2 is formed on a surface of the substrate 1 to define a device isolation region. The field oxide film 2 is formed by selective thermal oxidation treatment to surround a device region. A gate insulating film 3 and a gate electrode 4 are formed in the device region. The gate insulating film 3 is composed of a silicon oxide layer, a silicon nitride layer or a double layer of silicon oxide film and silicon nitride film. The gate electrode 4 is composed of polysilicon which is deposited by, for example, chemical vapor deposition and then patterned in a predetermined shape. The original gate insulating film 3 is partly etched away through a mask defined by the patterned gate electrode 4 concurrently with the patterning of the gate electrode 4 or after the patterning, so as to form a window portion. The thus prepared device region is covered with a natural oxide film 5.

Figure 1B:
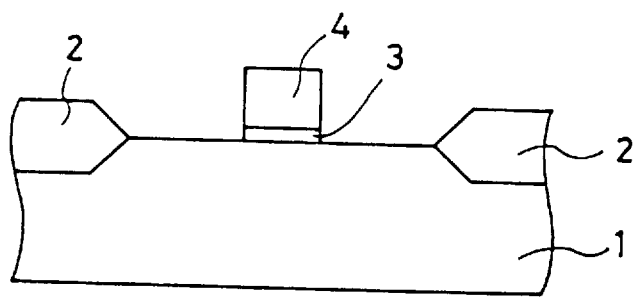

In the FIG. 1B step, an activation treatment or cleaning treatment is performed on a surface of the device region to remove the natural oxide film 5. For example, hydrogen gas ($H_2$) is introduced for five minutes into a vacuum chamber held at a background vacuum pressure less than $1 \times 10^{-4}$ Pa while heating the substrate 1 at 850° C. in the chamber, introduction of the gas raising the chamber pressure to $1.3 \times 10^{-2}$ Pa. Consequently, an active surface is exposed on the gate electrode 4 and on the window portion of the semiconductor layer not covered by the gate insulating film 3 within the device region.

Figure 1C:
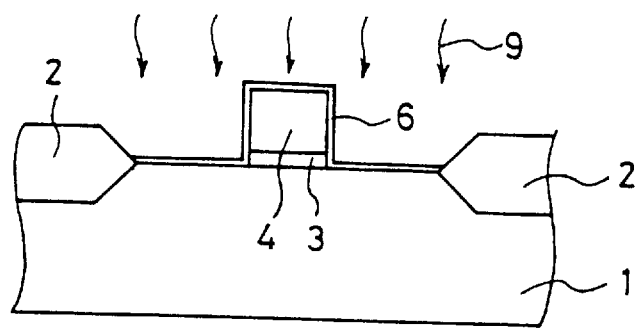

In the FIG. 1C step, diborane gas ($B_2H_6$) 9 is introduced at a pressure of $1 \times 10^{-3}$ Pa for 100 seconds while heating the substrate 1 at 825° C. so as to deposit an impurity adsorption film 6 on the exposed active surface over the gate electrode and the window portion of the semiconductor substrate. The impurity adsorption film 6 contains boron atoms produced by thermal dissociation of the diborane gas 9.

Figure 1D:
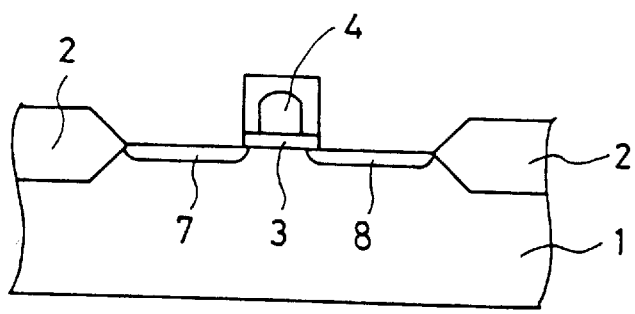

Lastly in the FIG. 1D step, annealing is effected such that the boron impurity contained in the adsorption film 6 is diffused into the gate electrode 4 by solid-phase diffusion to optimumly set the electrical conductance of the gate electrode 4. Concurrently, the boron impurity is diffused into the substrate 1 through the window portion to form source region 7 and drain region 8, which contain significant amounts of the boron P type impurity. The diffusion density and diffusion depth of the source region 7 and drain region 8 may depend on the amount of boron contained in the adsorption film 6 and on the annealing conditions. The amount of boron impurity can be controlled quite accurately by regulating the delivery pressure and delivery time period of the diborane gas 9 and the substrate temperature during the delivery of the diborane gas.

In the above described embodiment, the impurity components are distributed at relatively high concentration in the surface or outer portion of the gate electrode and at relatively low concentration in the inner portion of the gate electrode. Therefore, the amount of impurity diffused from the gate electrode 4 into the channel region through the gate insulating film 3 can be kept small.

Figure 2:
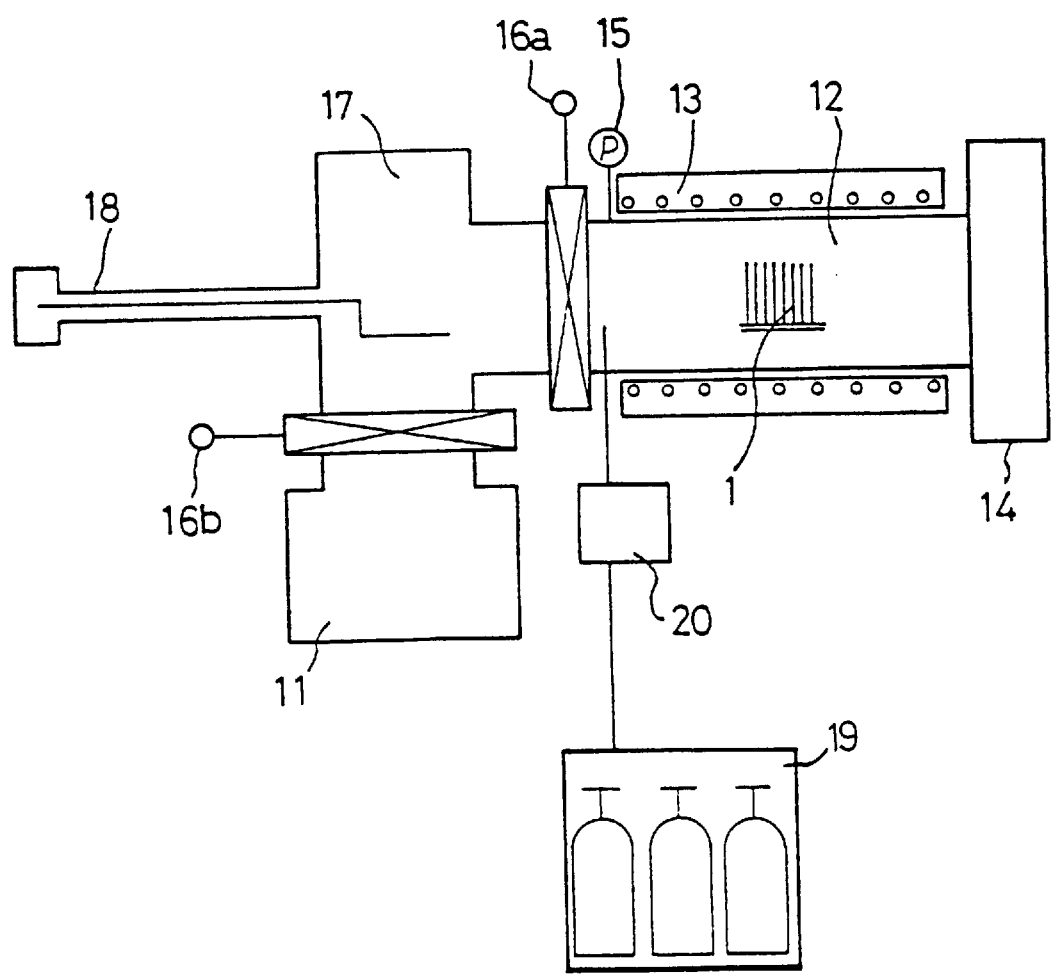
FIG. 2 is a simplified pictorial view showing an impurity doping apparatus used to practice the invention.

Next, a description will be given for an apparatus utilized for carrying out the inventive impurity doping method or MLD with reference to FIG. 2. As shown in FIG. 2, the impurity doping apparatus is composed of a vacuum chamber 12 made of quartz, in the center of which is placed a silicon substrate 1. A heating unit 13 is provided to controllably heat the substrate 1 to set a desired substrate temperature by an infrared lamp heating or resistance heating. The interior of vacuum chamber 12 can be evacuated to a high vacuum degree, low pressure level, by a high vacuum evacuation system 14 composed of a plurality of pumps including a main vacuum pump composed of a turbo molecular pump. A pressure gage 15 is utilized to continuously monitor the vacuum level of the chamber 12. A transportation mechanism 18 is utilized to transport the silicon substrate 1 to the chamber 12 from a loading chamber 17 through a gate valve 16a which is held open during transport. The loading chamber 17 is normally evacuated by another evacuation system 11 while a gate valve 16b is held open except during the transport of substrates to loading chamber 17 and during the transport of each substrate from loading chamber 17. A gas supply source 19 is connected to the vacuum chamber 12 through a gas flow control system 20. The gas supply source 19 contains a plurality of bottles for storing various gas species needed to carry out the inventive impurity doping. The gas flow control system 20 is operated to control gas species, gas charging time and gas charging pressure.

Next, a description will be given for the operation of the FIG. 2 apparatus to effect the inventive impurity doping. When doping impurity into a gate electrode and a pair of source and drain regions of an MIS transistor to establish the same conductivity type, an activation treatment or cleaning treatment is applied to a surface of the gate electrode and a surface of a device region not covered by a gate insulating film. Namely, the silicon substrate 1 is placed in the center of the vacuum chamber 12 held at a background vacuum pressure below $1 \times 10^{-4}$ Pa. Then, hydrogen gas is introduced into the chamber 12 from the gas supply source 19 while maintaining the temperature of the substrate 1 at, for example, 850° C. The hydrogen gas flows into the chamber 12 for a predetermined time interval in a manner such that the chamber pressure is brought to $1.3 \times 10^{-2}$ Pa. By this treatment, an inert film, i.e. a natural oxide film, is removed from the gate electrode surface and from the surface of the device region not covered by the gate insulating film, thereby exposing a chemically active silicon surface. This activation treatment is important for preparation of the following adsorption treatment. Namely, the adsorption film is selectively deposited only on the active silicon surface.

Subsequently, the adsorption treatment is carried out by delivering a source gas into the chamber 12. The substrate 1 is heated to a temperature in the range from 400° C. to 900° C. The source gas is composed of a gaseous compound containing an impurity component of P or N type. For example, diborane gas ($B_2H_6$) containing P type impurity component of boron is introduced into the chamber to form the adsorption film containing boron.

Lastly, the substrate 1 is annealed for a predetermined time interval to effect diffusion of the boron impurity from a diffusion source constituted by adsorption film 6. The diffused boron impurity is activated concurrently.

As described above, when forming the gate electrode and the source and drain regions according to the inventive impurity doping method, the impurity components are directly deposited on the active surface of the semiconductor material without an intermediate oxide film. Therefore, the impurity dose can be accurately controlled as compared to the conventional predeposition. Since the impurity is diffused internally by an annealing treatment after adsorption of the impurity on the active surface, a quite shallow junction can be formed as compared to the conventional ion implantation by which an impurity particle is initially injected in a certain depth.

FIGS. 3A–3D show successive steps of a variation of the inventive method for producing an MIS transistor.

Figure 3A:
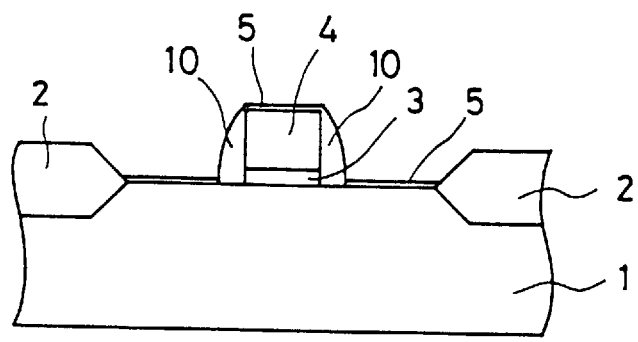
FIGS. 3A–3D are views similar to those of FIGS. 1 showing another embodiment of a method according to the invention.

In the FIG. 3A step, a semiconductor substrate 1 composed of silicon subjected to initial fabrication operations. A field oxide film 2 is formed on a surface of the substrate 1. A gate insulating film 3 and a gate electrode 4 are formed in a device region of the substrate. A side wall 10 is formed around the gate electrode 4. The side wall 10 is formed by CVD deposition of a thick silicon oxide film deposited on the patterned gate electrode 4 followed by anisotropic etching of the thick film to leave sidewall 10. The side wall 10 has a thickness (horizontal) smaller than an expected value of horizontal diffusion span. After or during formation of the side wall 10, the thick oxide film is removed by dry etching or wet etching from a top surface of the gate electrode 4 and from a window portion extending between the side wall 10 and the field oxide film 2. However, a thin natural oxide film 5 may be formed on the top surface of the gate electrode 4 and on the window portion immediately after removing the thick oxide film.

Figure 3B:
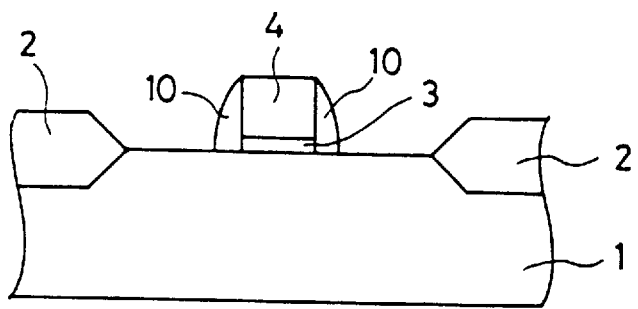

In the FIG. 3B step, the natural oxide film 5 is removed by activation treatment in a manner similar to the FIG. 1B step of the previous embodiment. Consequently, a silicon active surface is exposed on the top surface of the gate electrode 4 and on the window portion existing between the edge of the gate insulating film 3 or side wall 10 and the edge of the field oxide film 2.

Figure 3C:
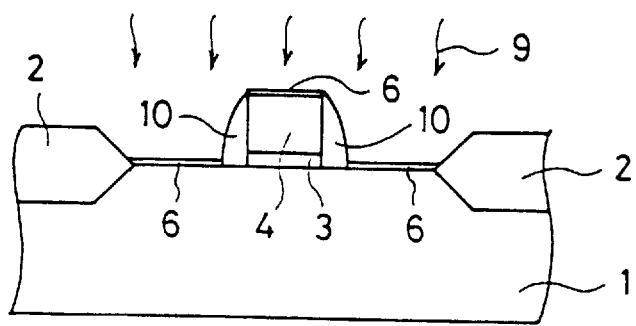

In the FIG. 3C step, diborane gas 9 is introduced in a manner similar to the FIG. 1C step of the previous embodiment. Consequently, an impurity adsorption film 6 is deposited on the top surface of the gate electrode 4 which is not covered by the side wall 10 and on the exposed window portion.

Figure 3D:
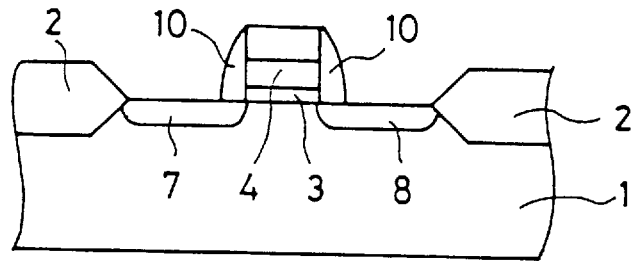

Lastly in the FIG. 3D step, an annealing treatment is carried out so that the boron impurity contained in the impurity adsorption film 6 is diffused into the gate electrode 4 by solid-phase diffusion to optimumly set the electric conductance of the gate electrode.

Concurrently, the impurity is diffused into the window portion to form a source region 7 and a drain region 8, having significant amounts of the P type dopant. The source region 7 and the drain region 8 are formed such that their PN junction portions extend under the gate electrode 4 in order to avoid offset. For this, the annealing temperature and time are optimumly set so that the impurity atoms diffuse horizontally from the impurity adsorption film 6 through a diffusion distance which exceeds the thickness of the side wall 10. For example, the substrate 1 is annealed at 850° C for thirty minutes so that the diffusion region extends horizontally by about 0.1 $\mu$m.

In the above described embodiment, the gate electrode 4 has the same conductivity type as the source region 7 and drain region 8. Since the gate electrode 4 is surrounded by the side wall 10 along its side edge, the impurity adsorption film 6 is deposited only on the top surface of the gate electrode. Accordingly, after the annealing treatment for diffusion and activation of the impurity atoms, the impurity atoms are distributed at relatively high concentration in the upper section of the gate electrode 4 and at relatively low concentration in the lower section thereof in the vicinity of the gate insulating film 3. Therefore, the amount of diffused impurities is further reduced, as compared to the previous embodiment, from the gate electrode to the channel region.

In the above described embodiment, the diborane gas is utilized to dope a silicon layer with a P type impurity. However, use can be made of other compound gas species of Group III elements such as trimethyl gallium (TMG) and boron trichloride ($BCl_3$). On the other hand, doping the silicon layer with an N type impurity can be effected by various gas compound species of Group V elements, such as arsine ($AsH_3$), phosphorus trichloride ($PCl_3$), antimony pentachloride ($SbCl_5$) and phosphine ($PH_3$).

Suitable substrate temperatures are set for the cleaning treatment, adsorption treatment and diffusion treatment in the above described embodiments. Generally, the substrate temperature may be optimumly set in the range from 800° C. to 1200° C. for the surface cleaning or activation treatment in conjunction with the level of background pressure and ambient gas species. However, it should be noted that the cleaning treatment can be effected in other ways such as application of HF gas or irradiation with ultraviolet radiation, effective to remove a natural oxide film. The substrate temperature is generally set optimumly in the range from 400° C. to 950° C. for the adsorption treatment. The substrate temperature for the diffusion treatment may be preferably set in the range comparable to that of the adsorption treatment. Annealing after the adsorption of the impurity can be effected by rapid thermal annealing using an IR lamp, laser beam annealing or plasma annealing so as to form further shallow diffusion depth in the source region 7 and the drain region 8.

Figure 4:
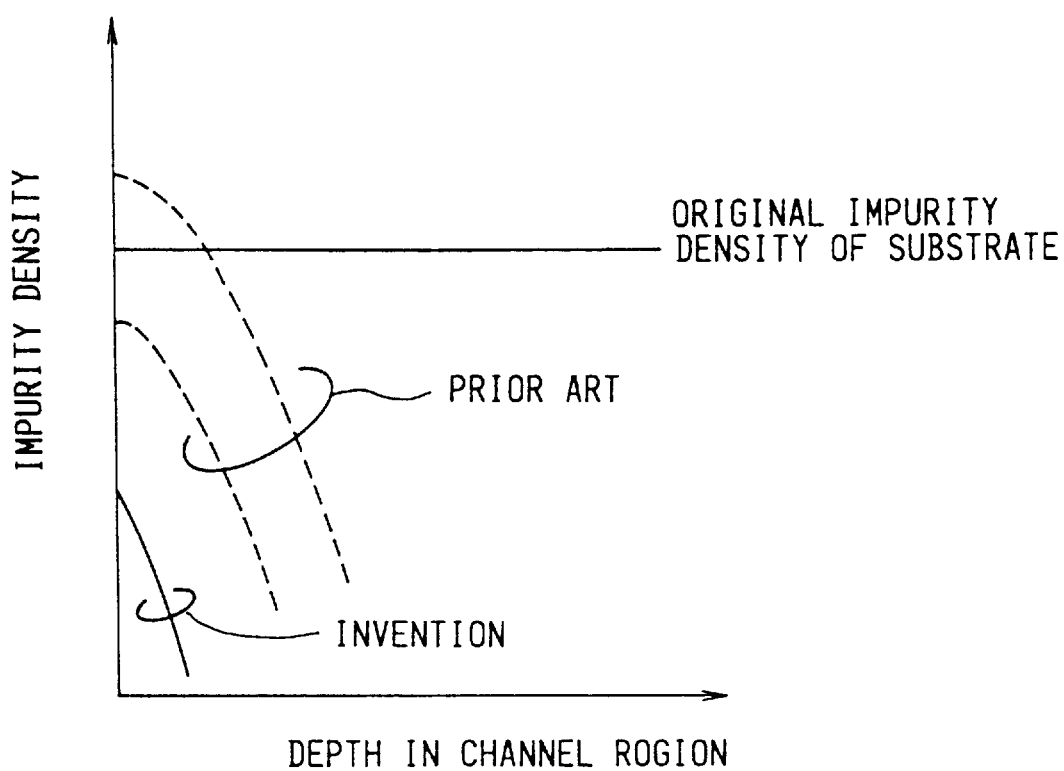
FIG. 4 is a diagram showing impurity distribution in a channel region under the gate electrode.

As described above, according to the invention, the gate electrode and the pair of source and drain regions are concurrently doped with impurity of the same conductivity type. The doped impurity atoms are distributed at relatively high concentration in the upper section of the gate electrode and at relatively low concentration in the vicinity of the gate insulating film in contrast to the conventional ion implantation and predeposition technology, thereby efficiently suppressing undesired diffusion of the impurity from the gate electrode into the channel region. This is clearly depicted in the FIG. 4 graph. Therefore, the inventive method can effectively avoid shifting of transistor threshold voltage and reduction of carrier mobility due to an increase of the impurity concentration in the channel region.

This application relates to subject matter disclosed in Japanese Application No. 1-318560 filed Dec. 6, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing an MIS transistor, comprising:

forming a transistor device region bordered by a field oxide film in a surface of a semiconductor substrate;

forming a gate insulating film on the device region and a gate electrode on the gate insulating film, the gate insulating film and the gate electrode being separated from the field oxide film by a semiconductor layer of the device region, the semiconductor layer defining a source region and a drain region;

evacuating a chamber at a pressure of less than $1 \times 10^{-4}$ Pa;

removing a natural oxide film from a surface of the gate electrode and from a surface of the semiconductor layer, in the evacuated chamber after said steps of forming a transistor device region and forming a gate insulating film and a gate electrode by a procedure which includes at least one of a reduction reaction and a heat treatment to expose an active surface;

applying a gas containing an impurity component to the active surface and heating the substrate to a temperature between 400° C. and 950° C. to form an adsorption film containing the impurity component selectively on the active surface, wherein said step of applying a gas comprises applying a gas compound containing the impurity component as one ingredient to form the adsorption film; and annealing the substrate to diffuse the impurity component from the adsorption film into the gate electrode and into the semiconductor layer to form the source and drain regions so that the gate electrode has the same conductivity type as the source and drain regions.

2. A method of producing an MIS transistor, comprising:

forming a transistor device region bordered by a field oxide film in a surface of a semiconductor substrate;

forming a gate insulating film on the device region and a gate electrode on the gate insulating film, the gate insulating film and the gate electrode being separated from the field oxide film by a semiconductor layer of the device region, the semiconductor layer defining a source region and a drain region;

evacuating a chamber at a pressure of less than $1 \times 10^{-4}$ Pa;

removing a natural oxide film from a surface of the gate electrode and from a surface of the semiconductor layer, in the evacuated chamber after said steps of forming a transistor device region and forming a gate insulating film and a gate electrode by a procedure which includes at least one of a reduction reaction and a heat treatment to expose an active surface;

applying a gas containing an impurity component to the active surface and heating the substrate to a temperature between 400° C. and 950° C. to form an adsorption film containing the impurity component selectively on the active surface, wherein said step of applying a gas is carried out at a pressure of $1 \times 10^{-3}$ Pa; and annealing the substrate to diffuse the impurity component from the adsorption film into the gate electrode and into the semiconductor layer to form the source and drain regions so that the gate electrode has the same conductivity type as the source and drain regions.

* * * * *